(12) United States Patent
Min et al.

(10) Patent No.: US 11,791,286 B2
(45) Date of Patent: Oct. 17, 2023

(54) SEMICONDUCTOR DEVICE AND SEMICONDUCTOR PACKAGE

(71) Applicant: Samsung Electronics Co., Ltd., Suwon-si (KR)

(72) Inventors: Youn-ji Min, Seoul (KR); Seok-hyun Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 136 days.

(21) Appl. No.: 17/405,487

(22) Filed: Aug. 18, 2021

(65) Prior Publication Data

US 2021/0384144 A1 Dec. 9, 2021

Related U.S. Application Data

(63) Continuation of application No. 15/700,504, filed on Sep. 11, 2017, now abandoned.

(30) Foreign Application Priority Data

Sep. 12, 2016 (KR) .................. 10-2016-0117370

(51) Int. Cl.
*H01L 23/00* (2006.01)
(52) U.S. Cl.
CPC ............ *H01L 23/562* (2013.01); *H01L 24/03* (2013.01); *H01L 24/05* (2013.01); *H01L 24/13* (2013.01);
(Continued)
(58) Field of Classification Search
CPC .................. H01L 24/13; H01L 23/562; H01L 2224/13021; H01L 2224/13007;
(Continued)

(56) References Cited

U.S. PATENT DOCUMENTS

| 5,943,597 A | 8/1999 | Kleffner et al. |
| 6,255,586 B1 | 7/2001 | Kim et al. |

(Continued)

FOREIGN PATENT DOCUMENTS

| JP | 2010-267641 A | 11/2010 |
| KR | 10-2000-0018729 A | 4/2000 |
| KR | 101622455 B1 | 5/2016 |

OTHER PUBLICATIONS

Non-Final Office Action dated Jul. 12, 2018 in U.S. Appl. No. 15/700,504.

(Continued)

*Primary Examiner* — Dale E Page
*Assistant Examiner* — Abbigale A Boyle
(74) *Attorney, Agent, or Firm* — Harness, Dickey & Pierce, P.L.C.

(57) ABSTRACT

Some example embodiments relate to a semiconductor device and a semiconductor package. The semiconductor package includes a substrate including a conductive layer, an insulating layer coating the substrate, the insulating layer including an opening exposing at least part of the conductive layer, and an under-bump metal layer electrically connected to the at least part of the conductive layer exposed through the opening, wherein the insulating layer includes at least one recess adjacent to the opening, and the under-bump metal layer fills the at least one recess. The semiconductor device and the semiconductor package may have improved drop test characteristics and impact resistance.

20 Claims, 22 Drawing Sheets

(52) U.S. Cl.
CPC ..... *H01L 24/11* (2013.01); *H01L 2224/02125* (2013.01); *H01L 2224/03462* (2013.01); *H01L 2224/03464* (2013.01); *H01L 2224/0401* (2013.01); *H01L 2224/05022* (2013.01); *H01L 2224/05024* (2013.01); *H01L 2224/05027* (2013.01); *H01L 2224/05554* (2013.01); *H01L 2224/05555* (2013.01); *H01L 2224/05556* (2013.01); *H01L 2224/05557* (2013.01); *H01L 2224/05559* (2013.01); *H01L 2224/05572* (2013.01); *H01L 2224/1132* (2013.01); *H01L 2224/11462* (2013.01); *H01L 2224/11464* (2013.01); *H01L 2224/11849* (2013.01); *H01L 2224/13021* (2013.01); *H01L 2224/13023* (2013.01); *H01L 2924/3512* (2013.01); *H01L 2924/35121* (2013.01)

(58) Field of Classification Search
CPC ... H01L 2224/05027; H01L 2224/0401; H01L 2924/3512
See application file for complete search history.

(56) References Cited

U.S. PATENT DOCUMENTS

| | | | |
|---|---|---|---|
| 6,472,763 B2 | 10/2002 | Fukuda et al. | |
| 6,563,216 B1 | 5/2003 | Kimura et al. | |
| 7,364,998 B2 | 4/2008 | Chiu et al. | |
| 7,521,812 B2 | 4/2009 | Lee et al. | |
| 7,663,250 B2 | 2/2010 | Jeon et al. | |
| 7,667,336 B2 | 2/2010 | Ishio | |
| 7,728,431 B2 * | 6/2010 | Harada | H01L 24/12 257/750 |
| 7,859,122 B2 | 12/2010 | Daubenspeck et al. | |
| 7,977,789 B2 | 7/2011 | Park | |
| 8,120,176 B2 | 2/2012 | Shin et al. | |
| 8,508,043 B2 | 8/2013 | Daubenspeck et al. | |
| 8,575,749 B2 | 11/2013 | Tsujimoto | |
| 8,853,072 B2 | 10/2014 | Wood et al. | |
| 9,013,038 B2 | 4/2015 | Chen et al. | |
| 9,018,757 B2 | 4/2015 | Tsai et al. | |
| 9,087,795 B2 | 7/2015 | Stacey | |
| 9,136,235 B2 | 9/2015 | Tu et al. | |
| 9,349,665 B2 | 5/2016 | Chen et al. | |
| 9,379,075 B2 | 6/2016 | Chen et al. | |
| 9,502,366 B2 * | 11/2016 | Ho | H01L 24/05 |
| 9,536,846 B2 * | 1/2017 | Park | H01L 21/6835 |
| 9,768,135 B2 * | 9/2017 | Yao | H01L 24/13 |
| 10,008,461 B2 | 6/2018 | Shih et al. | |
| 10,008,462 B2 | 6/2018 | Seo et al. | |
| 2007/0001301 A1 | 1/2007 | Wang | |
| 2007/0290343 A1 | 12/2007 | Harada et al. | |
| 2013/0113095 A1 * | 5/2013 | Chuang | H01L 24/11 257/737 |
| 2014/0203438 A1 | 7/2014 | Chen et al. | |
| 2017/0084558 A1 | 3/2017 | Seo et al. | |

OTHER PUBLICATIONS

Final Office Action dated Mar. 7, 2019 in U.S. Appl. No. 15/700,504.
Non-Final Office Action dated Dec. 12, 2019 in U.S. Appl. No. 15/700,504.
Final Office Action dated Jun. 12, 2020 in U.S. Appl. No. 15/700,504.
Non-Final Office Action dated Oct. 5, 2020 in U.S. Appl. No. 15/700,504.
Final Office Action dated May 13, 2021 in U.S. Appl. No. 15/700,504.
Official Communication dated May 17, 2023 in Korean Application No. 10-2016-0117370.

\* cited by examiner

SEMICONDUCTOR DEVICE AND SEMICONDUCTOR PACKAGE

CROSS-REFERENCE TO RELATED APPLICATION

This is a continuation of U.S. application Ser. No. 15/700,504, filed Sep. 11, 2017, which claims priority to Korean Application No. 10-2016-0117370, filed on Sep. 12, 2016, the disclosures of each of which are hereby incorporated by reference in their entirety.

BACKGROUND

The inventive concepts relate to a semiconductor device and a semiconductor package, and more particularly, to a semiconductor device and a semiconductor package which have remarkably improved properties such as, for example, drop test characteristics and impact resistance.

While becoming smaller and thinner, electronic devices are also becoming more vulnerable to external impacts. Therefore, it may be advantageous to improve the impact resistance of semiconductor devices and/or semiconductor packages installed in such small and thin electronic devices.

SUMMARY

The inventive concepts relate to a semiconductor package having remarkably improved drop test characteristics and impact resistance.

The inventive concepts relate to a semiconductor device having remarkably improved drop test characteristics and impact resistance.

According to some example embodiments, a semiconductor package includes a substrate including a conductive layer, an insulating layer coating the substrate, the insulating layer including an opening exposing at least part of the conductive layer, and an under-bump metal layer electrically connected to the at least part of the conductive layer exposed through the opening, wherein the insulating layer includes at least one recess adjacent to the opening, and the under-bump metal layer fills the at least one recess.

According to another example embodiment, a semiconductor device includes a semiconductor chip including a conductive layer, an insulating layer including at least one trench in an upper surface thereof, the insulating layer exposing at least part of the conductive layer, an under-bump metal layer electrically connected to the conductive layer, the under-bump metal layer at least partially filling the at least one trench, and a solder bump on the under-bump metal layer, wherein the at least one trench has a sidewall and a bottom, the sidewall and the bottom of the at least one trench are an integrated single body, and the at least one trench at least partially has a substantially constant width region in which a width of the at least one trench is maintained substantially constant and a constantly narrowing width region in which a width of the at least one trench decreases, towards the bottom of the at least one trench.

Some example embodiments relate to a semiconductor device that includes a substrate including a conductive layer, an insulating layer including at least one trench at an upper surface thereof and an opening exposing at least part of the conductive layer, and an under-bump conductive metal layer filling the at least one trench and at least part of the opening, the at least one trench being configured to at least reduce crack propagation through the substrate.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1:
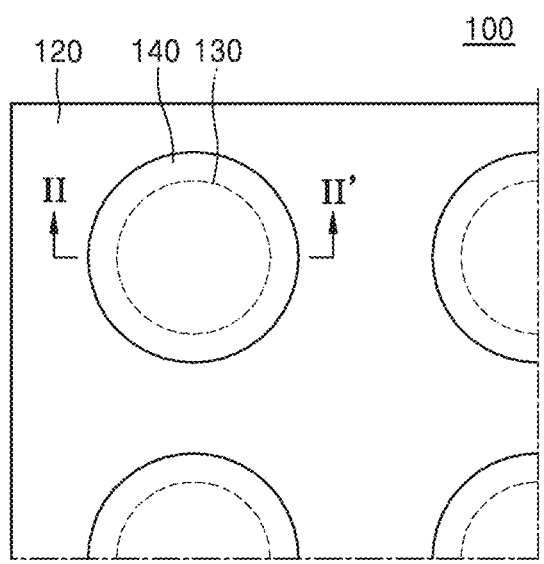
FIG. 1 is a partial plan view of a semiconductor device according to an example embodiment.
Figure 2:
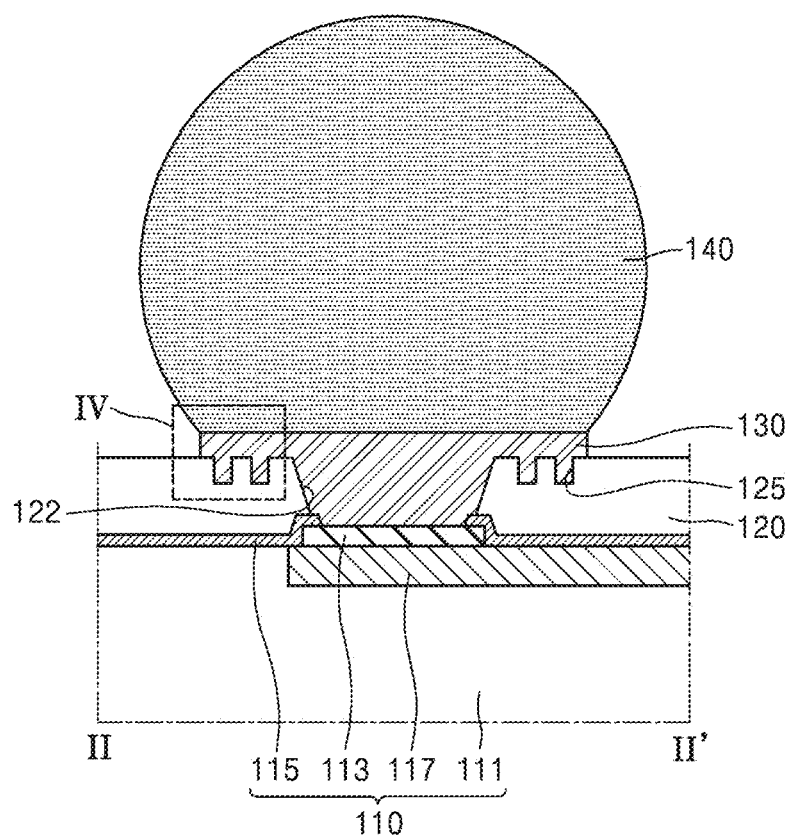
FIG. 2 is a partial sectional view taken along a line II-II' of FIG. 1.

FIG. 1 is a partial plan view of a semiconductor device 100 according to an example embodiment. FIG. 2 is a partial sectional view taken along a line II-IT of FIG. 1.

Referring to FIGS. 1 and 2, the semiconductor device 100 includes a substrate 110 including conductive layers 113 and 117, an insulating layer 120 which coats the substrate 110 while exposing at least part of the conductive layers 113 and 117 through an opening 122, an under-bump metal layer 130 which is electrically connected to the at least part of the conductive layers 113 and 117 exposed through the opening 122, and a conductive bump 140 on the under-bump metal layer 130.

The substrate 110 may be, for example, a substrate of a wafer level, or a substrate of a chip level which is cut from a wafer. When the substrate 110 is a chip unit substrate, the substrate 110 may be, for example, a memory chip, a logic chip, or the like. When the substrate 110 is a logic chip, the substrate 110 may be variously designed depending on, for example, an operation to be executed. When the substrate 110 is a memory chip, the memory chip may include, for example, a non-volatile memory chip. For example, the memory chip may include a flash memory chip. For example, the memory chip may include a NAND flash memory chip or a NOR flash memory chip. However, memory chips included in the semiconductor device 100 according to the inventive concepts are not limited thereto. In some example embodiments, the memory chip may include at least one of a phase-change random-access memory (PRAM), a magneto-resistive random-access memory (MRAM), and a resistive random-access memory (RRAM). When the substrate 110 is a wafer unit substrate, the substrate 110 may include a logic device or a memory device which performs a function as described above.

The conductive layers 113 and 117 may include a redistribution line 117 and a contact pad 113.

The redistribution line 117 may be provided on an interlayer insulating layer 111 of the substrate 110. In FIG. 2, although an upper surface of the redistribution line 117 appears to be on the same plane as an upper surface of the interlayer insulating layer 111, the redistribution line 117 may protrude above the upper surface of the interlayer insulating layer 111.

The redistribution line 117 may include a redistribution barrier layer and a redistribution metal layer. The redistribution barrier layer may include, for example, titanium (Ti), titanium nitride (TiN), titanium tungsten (TiW), tantalum (Ta), tantalum nitride (TaN), tungsten nitride (WN), or other metals having low reactivity. The redistribution metal layer may include copper (Cu). The redistribution metal layer may include, for example, nickel (Ni) and/or gold (Au) on a surface thereof.

The contact pad 113 may be provided on the redistribution line 117. The contact pad 113 may include a pad barrier layer, a pad seed layer, a pad metal layer, and/or a pad capping layer. The pad barrier layer may include, for example, a titanium (Ti), titanium nitride (TiN), titanium tungsten (TiW), tantalum (Ta), tantalum nitride (TaN), tungsten nitride (WN), or other metals having low reactivity. The pad seed layer may include a seed metal, such as copper (Cu), ruthenium (Ru), nickel (Ni), or tungsten (W). The pad metal layer may include copper or nickel. The pad capping layer may include gold (Au), silver (Ag), or nickel (Ni).

The redistribution line 117 and the surface of the substrate 110 may be coated by a passivation layer 115. That is, the passivation layer 115 may cover an upper surface of the redistribution line 117 and sides of the contact pad 113. The passivation layer 115 may include, for example, silicon nitride, silicon oxide, silicon oxynitride, tantalum oxide ($Ta_2O_5$), epoxy resin, phenol resin, polyimide (PI), benzocyclobutene (BCB), polybenzoxazole (PBO), or bismaleimide triazine (BT). However, example embodiments are not limited thereto.

The insulating layer 120 may be provided on the passivation layer 115. The insulating layer 120 may have an opening 122 which at least partially exposes the conductive layers 113 and 117. The insulating layer 120 may include any material which may be used for the passivation layer 115. The insulating layer 120 may, for example, include a filler-containing carbocyclic compound. In some example embodiments, the insulating layer 120 may include about 10 wt % to about 70 wt % of the filler-containing carbocyclic compound. The filter may be, for example, a $SiO_2$ filler. In some example embodiments, the filler may include an $SiO_2$ filler and an organic cushion filler. The filler may have an average particle size that is smaller than about 5 μm. In some example embodiments, the filler may be formed of or include a $SiO_2$ filler having an average particle size of about 1 μm and an organic cushion filler having an average particle size of about 0.5 μm. In some example embodiments, the insulating layer 120 may be formed of or include an Ajinomoto build-up film (ABF).

The insulating layer 120 may include at least one recess 125 adjacent to the opening 122. The at least one recess 125 may be formed in an upper surface of the insulating layer 120. This will be described later in detail with reference to FIGS. 4A to 4D, which are enlarged views of a portion IV of FIG. 2.

The under-bump metal layer 130 may be provided in the opening 122. The under-bump metal layer 130 may be configured to be as an adhesive layer, a wetting layer, and/or a diffusion preventing layer. The under-bump metal layer 130 may be configured as a single layer or a multi-layer structure. When the under-bump metal layer 130 is configured as a multi-layer structure, the under-bump metal layer 130 may include an adhesive layer configured to bind to an underlying layer, a diffusion preventing layer for reducing or substantially preventing diffusion of a metal material, and a wetting layer for wetting the conductive bump 140. The adhesive layer may include, for example, titanium (Ti), chromium (Cr), zinc (Zn), tungsten (W), molybdenum (Mo), nickel (Ni), or an alloy thereof. The diffusion preventing layer may include nickel (Ni), molybdenum (Mo), or an alloy thereof. The wetting layer may include a material which may form an intermetallic compound (IMC) with a solder. The wetting layer may include, for example, cobalt (Co), copper (Cu), gold (Au), nickel (Ni), silver (Ag), or an alloy thereof.

The under-bump metal layer 130 may fill an inner space of the at least one recess 125. The under-bump metal layer 130 may substantially completely fill the inner space of the at least one recess 125 without any void therein. In some example embodiments, the under-bump metal layer 130 may at least partially fill the at least one recess 125 while leaving a void at the core of the at least one recess 125.

In some example embodiments, substantially the entire upper surface of the under-bump metal layer 130 may be planar. In some other example embodiments, the upper surface of the under-bump metal layer 130 may be concave or flat to conform to a shape of the insulating layer 120. That is, a portion of the upper-bump metal layer 130 which corresponds to the opening 122 may be concave to conform to the opening 122, and a portion of the under-bump metal layer 130 around the opening 122 may have a substantially flat upper surface.

The conductive bump 140 may be provided on the under-bump metal layer 130. The conductive bump 140 may include, for example, aluminum (Al), tin (Sn), nickel (Ni), gold (Au), silver (Ag), copper (Cu), lead (Pb), a combination thereof, or an alloy thereof. The conductive bump 140 may include, for example, copper (Cu), tin (Sn), tin/bismuth (Sn/Bi), tin/copper (Sn/Cu), tin/silver (Sn/Ag), tin/gold (Sn/Au), or tin/silver/copper (Sn/Ag/Cu).

Figure 3A:
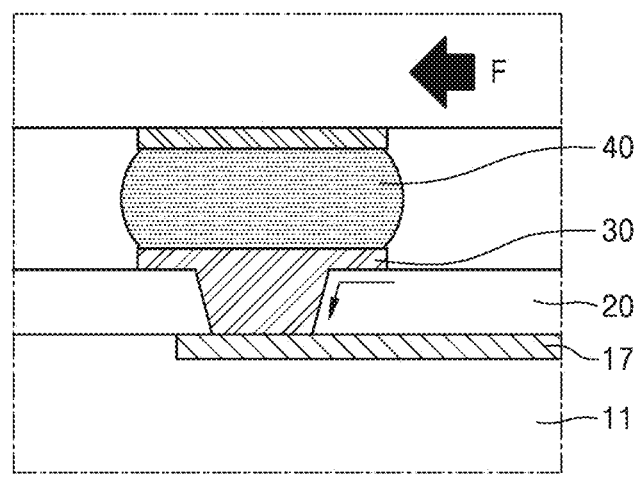
FIGS. 3A and 3B are schematic conceptual views illustrating semiconductor devices respectively with and without a recess, for explaining a configuration of the recess.
Figure 3B:
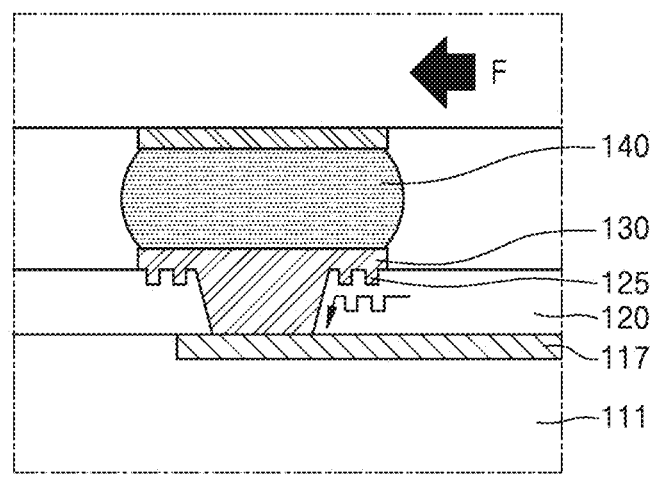
Figure 3C:
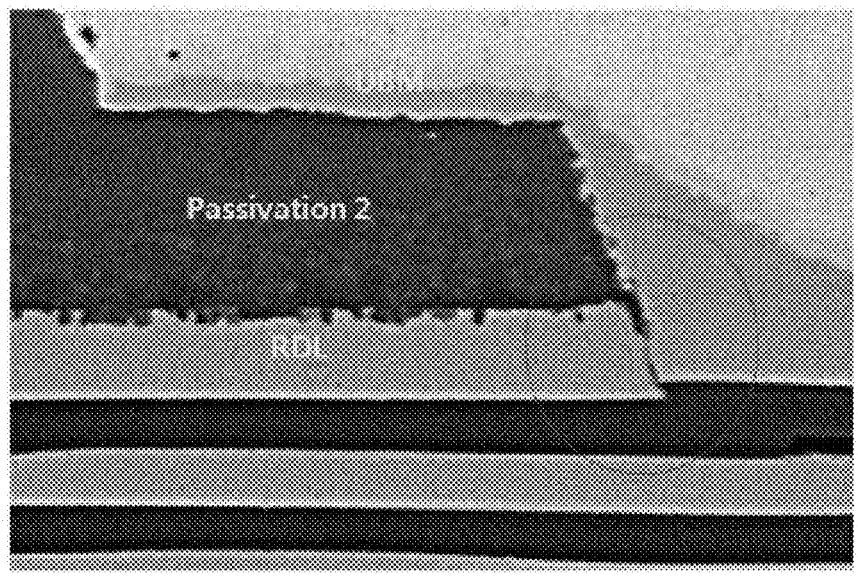
FIG. 3C is an image illustrating a rupture failure of a redistribution line when a recess is not formed.

FIGS. 3A and 3B are schematic conceptual views illustrating respectively semiconductor devices with and without the recess 125, for describing the recess 125. FIG. 3C is an image illustrating a rupture failure of a redistribution line when a recess is not formed.

FIG. 3A illustrates a semiconductor device in which no recess is formed. FIG. 3B illustrates a semiconductor device in which the recess 125 is formed. In FIGS. 3A and 3B, it is assumed that a force is exerted in a direction indicated by an arrow F in a drop test.

Referring to FIG. 3A, the force F may be transmitted to a conductive bump 40 and an under-bump metal layer 30. Once a crack has occurred, the crack may also be readily transmitted to a conductive layer 17 along an interface between the under-bump metal layer 30 and an insulating layer 20. As a result, as illustrated in FIG. 3C, a rupture failure of a redistribution line (RDL) may occur.

Referring to FIG. 3B, the force F may be transmitted to the conductive bump 140 and the under-bump metal layer 130 as in FIG. 3A. However, due to the recess 125, a crack propagation path may become far longer and complicated. In other words, since the crack propagation path is elongated due to the recess 125, the intensity of the force F transmitted to the redistribution line 117 may be reduced. Furthermore, since the side walls of the recess 125 may inhibit or reduce the force transmission to the redistribution line 117, the scale of cracks propagated to the redistribution line 117 may be further reduced.

Therefore, when the recess 125 is formed, the drop test characteristics and the impact resistance of a semiconductor device may be significantly improved.

FIGS. 4A to 4D are partial enlarged views of the portion IV of FIG. 2, according to example embodiments. FIG. 4E is a partial enlarged view for illustrating analysis of a force exerted on a sidewall of the recess 125 when the sidewall of the recess 125 slants at an obtuse angle with respect to an upper surface of the insulating layer 20.

Figure 4A:
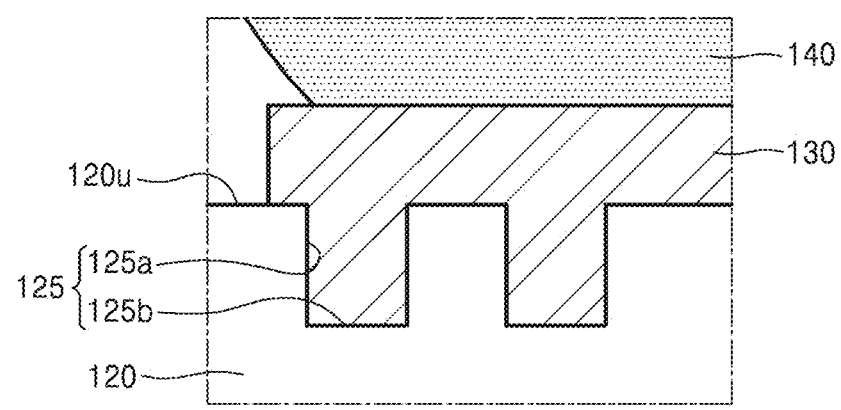
FIGS. 4A to 4D are partial enlarged views of a portion IV of FIG. 2, according to example embodiments.

First, referring to FIG. 4A, the recess 125 includes a sidewall portion including a sidewall 125a and a bottom portion including a bottom 125b. Although the bottom 125b is illustrated as being flat in FIG. 4A, the bottom 126b may not be flat. For example, the bottom 125b may be concave.

In particular, the sidewall 125a and the bottom 125b may be an integral single body. In other words, the sidewall portion and the bottom portion may be an integral single body. Therefore, there may not be an interface between the sidewall 125a and the bottom 125b. If there is an interface between the sidewall 125a and the bottom 125b, a force may be transmitted through the interface during a drop test, causing cracking.

Whether there is an interface between the sidewall 125a and the bottom 125b may be identified by a variety of methods, for example, by using equipment such as an optical microscope, a scanning electron microscope (SEM), or a transmission electron microscope (TEM). The sidewall 125a and the bottom 125b may not necessarily be formed through a single step, as long as there is no interface between the sidewall 125a and the bottom 125b.

In the example embodiment of FIG. 4A, the sidewall 125a may be substantially perpendicular with respect to an upper surface 120u of the insulating layer 120. Due to the sidewall 125a that is substantially perpendicular with respect to the upper surface 120u, force transmission in a lateral direction may be effectively blocked, and a crack propagation path may be extended. Furthermore, the length of the crack propagation path may also be controlled by adjusting the depth of the recess 125.

Figure 4B:
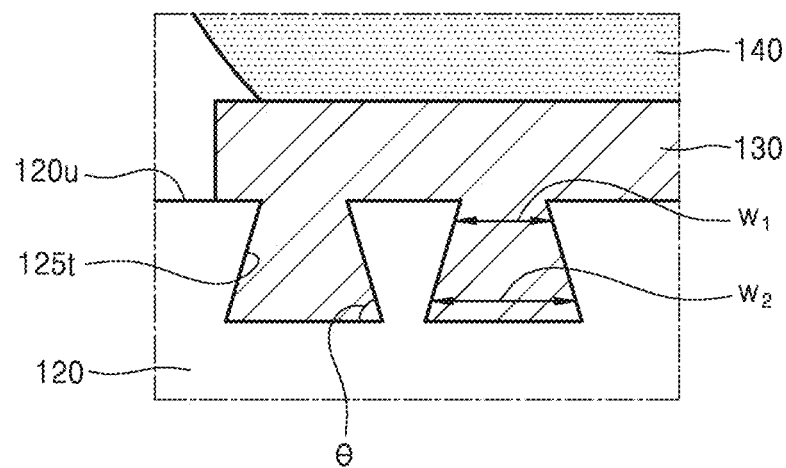

Referring to FIG. 4B, a recess 125t may have a trapezoidal cross-sectional shape so that the recess 125t may have an increasing width towards a substrate. That is, a width W2 of the recess 125t in a region that is closer to the substrate is larger than a width W1 in a region that is farther away from the substrate, as illustrated in FIG. 4B.

In particular, a sidewall of the recess 125t may be at an angle θ with respect to a bottom of the recess 125t. Accordingly, the sidewall of the recess 125t may be at an angle θ with respect to the upper surface 123u. The angle θ may be an acute angle less than 90°. In this case, a lateral force may be exerted on the under-bump metal layer 130 towards the insulating layer 120, thus reducing or suppressing reduction in adhesion strength between the under-bump metal layer 130 and the insulating layer 120.

Referring to FIG. 4E, a sidewall of a recess may slant at an obtuse angle with respect to an upper surface of the insulating layer 20. Accordingly, when a lateral force f is exerted on the recess, a force $f_N$ may be exerted in a direction substantially perpendicular to the sidewall of the recess and a force $f_H$ may be exerted in a direction substantially parallel to the sidewall of the recess. Thus, unlike in the example embodiments of FIGS. 4A and 4B, a force exerted on the under-bump metal layer 30 may create a force in a direction away from the insulating layer 20, so that the impact resistance improvement effect may be relatively insufficient.

Figure 4C:
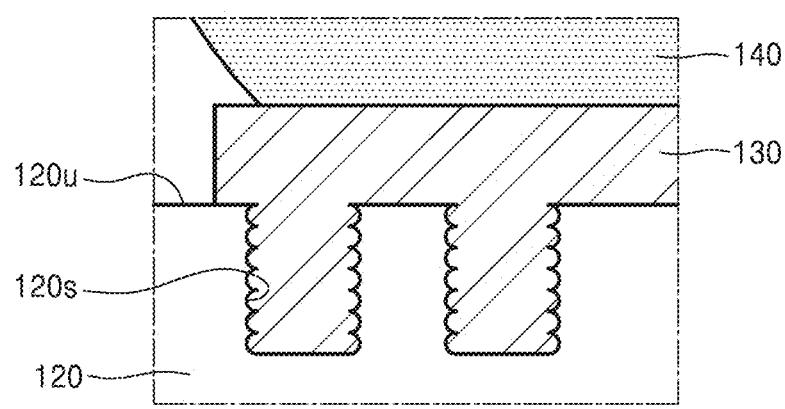

Referring to FIG. 4C, in an example embodiment, a recess 125s may have a scalloped sidewall. Each, or at least one, of the scallops on the sidewall of the recess 125c may extend in a horizontal direction. The plurality of scallops may be adjacent to one another in a depth direction of the recess 125.

The scallops on the recess 125 may have a unique shape resulting from a Bosch process or deep reactive ion etching (DRIE).

In this case, a crack generation and propagation path resulting from an external lateral force may have a further elongated length due to the scallops of the recess 125. The transmission of the force may also be comparatively effectively blocked, so that the impact resistance may be markedly improved. Due to a fixing effect of the under-bump metal layer 130 by the scallops in the recess 125s, a reduction in adhesion between the under-bump metal layer 130 and the insulating layer 120 by the external lateral force may be diminished or prevented.

Figure 4D:
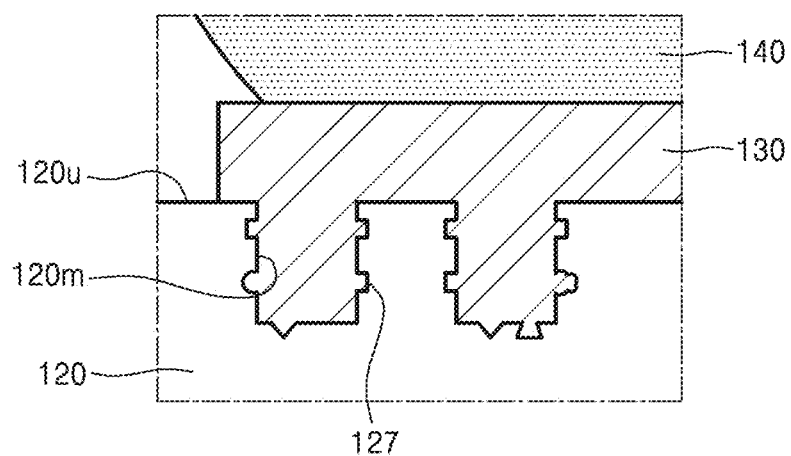
Figure 4E:
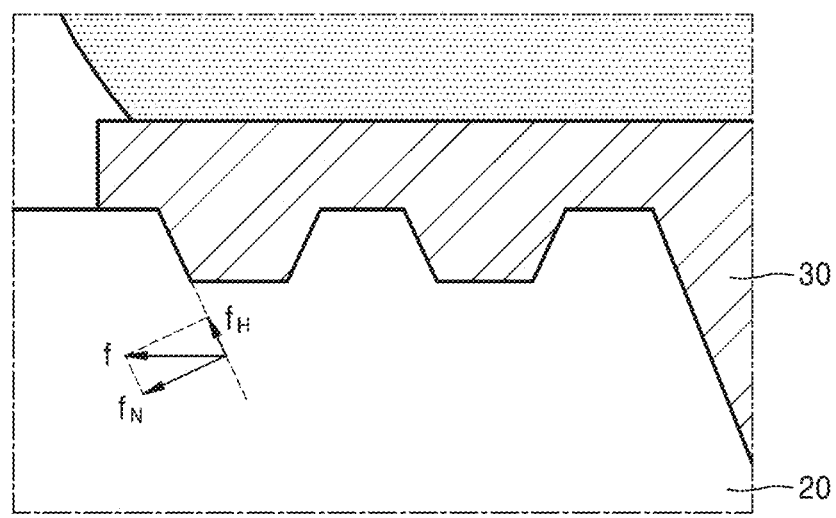
FIG. 4E is a partial enlarged view for illustrating analysis of a force exerted on a sidewall of a recess when the sidewall of the recess slants at an obtuse angle with respect to an upper surface of an insulating layer.

Referring to FIG. 4D, a recess 125m may further include micro-recesses 127 on a sidewall thereof. The micro-recesses 127 may be randomly distributed on the sidewall of the recess 125m. The micro-recesses 127 may have any of a variety of shapes, for example, a triangular, rectangular, circular, or elliptical cross-sectional shape. The micro-recesses 127 may be overlapped with one another.

The under-bump metal layers 130 may at least partially fill the micro-recesses 127. In this case, a crack generation and propagation path resulting from an external lateral force may have a further elongated length due to the micro-recesses 127, and consequentially the impact resistance may be improved.

Figure 5A:
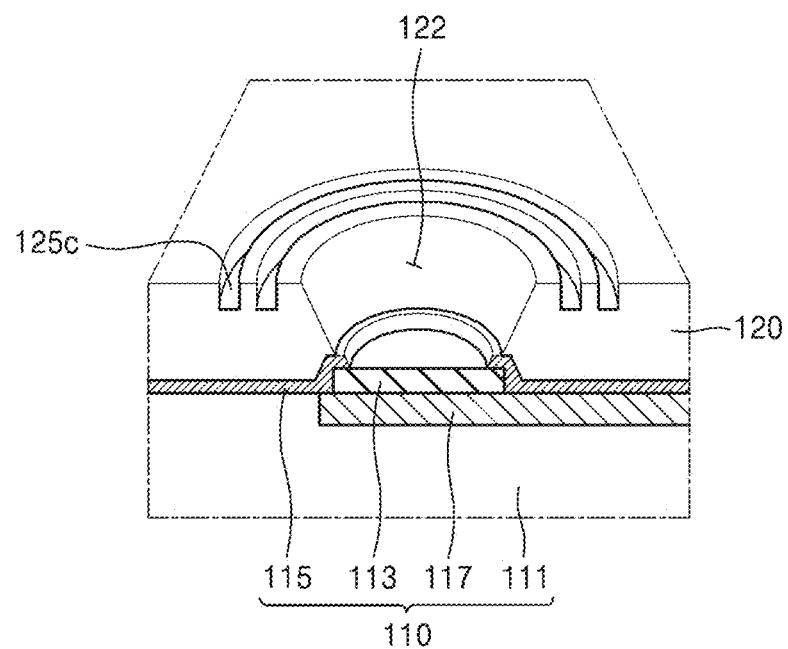
FIGS. 5A to 5C are partial cross-sectional perspective views of recesses according to example embodiments.
Figure 5B:
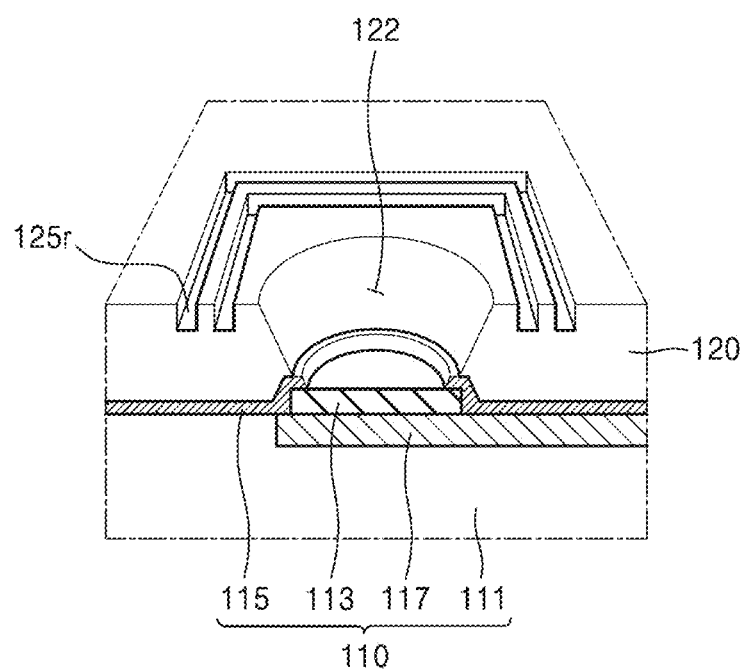
Figure 5C:
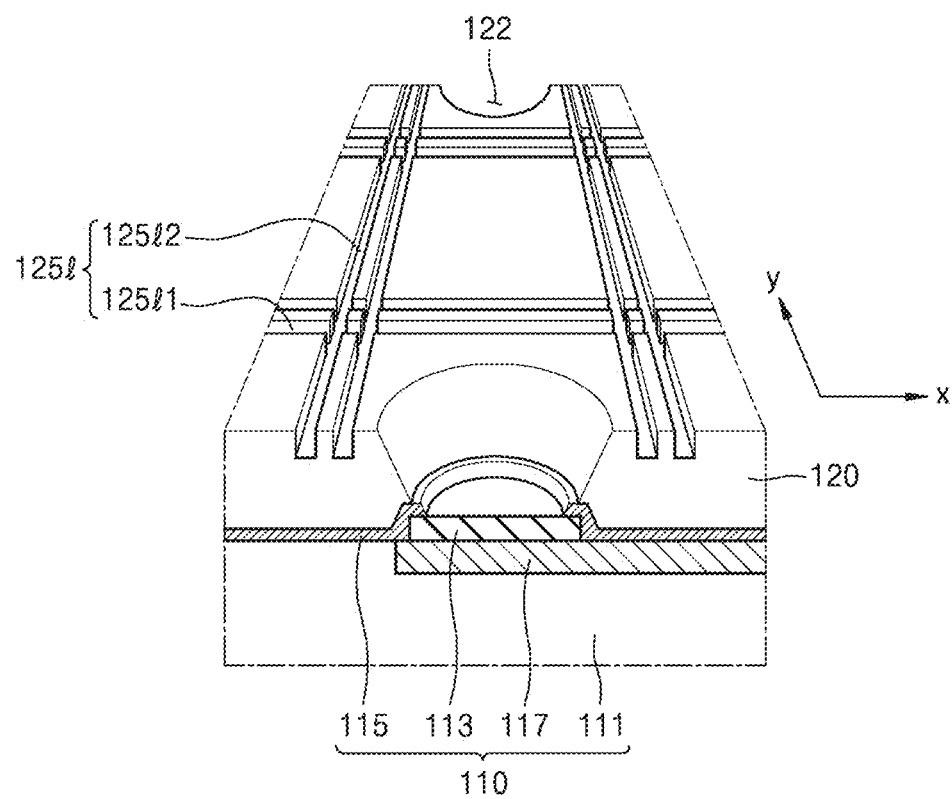

FIGS. 5A to 5C are partial cross-sectional perspective views of recesses according to example embodiments. In FIGS. 5A to 5C, the under-bump metal layer 130 and the conductive bump 140 are omitted to more clearly illustrate shapes and structures of underlying structures below the under-bump metal layer 130 and the conductive bump 140.

Referring to FIG. 5A, a recess 125c may be formed as a circular trench surrounding an opening 122. Referring to FIG. 5B, a recess 125r may be formed as a rectangular or square trench surrounding an opening 122. The recesses 125c and 125r surrounding the opening 122 may effectively substantially block an external lateral force regardless of the direction in which the external lateral force is exerted, may increase a length of a crack propagation path, and consequentially may contribute to improving the impact resistance of the semiconductor device 100.

Referring to FIG. 5C, a recess 125l may include a first recess 125l_1 extending in a first direction (the x-direction) and a second recess 125l_2 extending in a second direction (the y-direction). The first recess 125l_1 and the second recess 125l_2 may extend to the extent that the first recess 125l_1 and the second recess 125l_2 are shared by two adjacent openings 122.

In this example embodiment, the transmission path of a horizontal direction force applied in the x direction may be elongated by the second recess 125l_2, and the transmission path of a horizontal direction force applied in the y direction may be elongated by the first recess 125l_1. The transmission path of a horizontal direction force applied in any other directions may be elongated by both the first recess 125l_1 and the second recess 125l_2.

Therefore, the recess 125l may effectively substantially block a lateral force regardless of the direction in which the lateral force is exerted, may increase a length of the transmission path of the force, and consequentially may contribute to improving the impact resistance of the semiconductor device 100.

Figure 6:
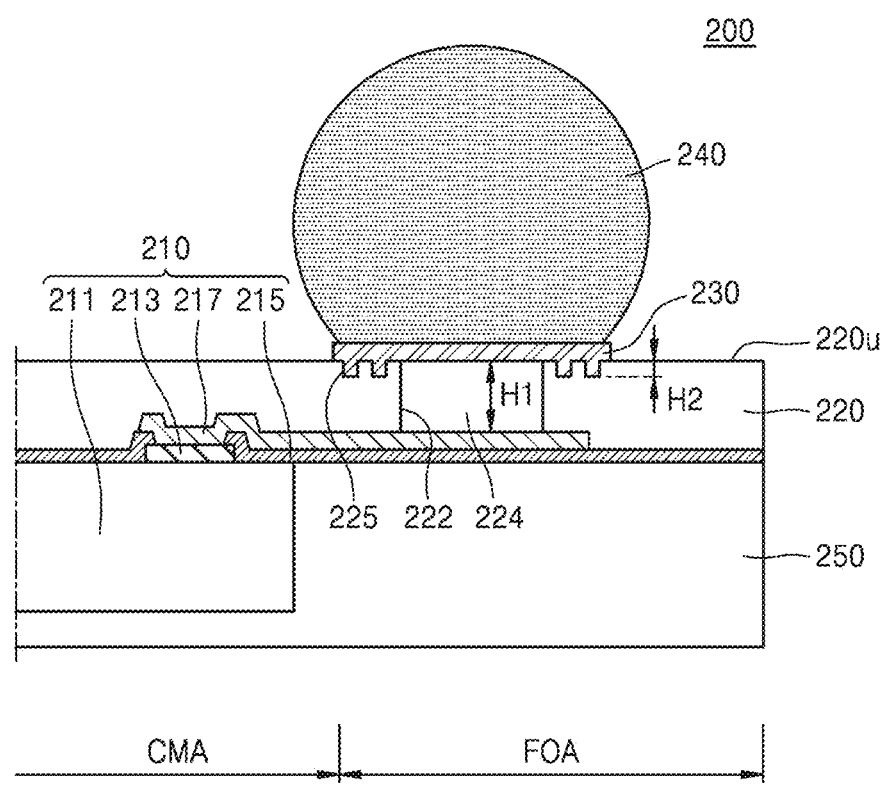
FIG. 6 is a partial sectional view of a semiconductor package according to an example embodiment.

FIG. 6 is a partial sectional view of a semiconductor package 200 according to an example embodiment.

Referring to FIG. 6, the semiconductor package 200 may include a chip mounting area CMA in which a semiconductor die 211 is mounted, and a peripheral area FOA in which the semiconductor die 211 is not mounted.

A semiconductor substrate forming the semiconductor die 211 may include, for example, silicon (Si). In some example embodiments, the semiconductor substrate forming the semiconductor die 211 may include a semiconductor element such as germanium (Ge), or a compound semiconductor such as silicon carbide (SiC), gallium arsenide (GaAs), indium arsenide (InAs), and indium phosphide (InP). In some embodiments, the semiconductor substrate forming the semiconductor die 211 may have a silicon-on-insulator (SOI) structure. For example, the semiconductor substrate forming the semiconductor die 211 may include a buried oxide (BOX) layer. The semiconductor substrate forming the semiconductor die 211 may include a conductive area, for example, an impurity-doped well. The semiconductor substrate forming the semiconductor die 211 may have any of a variety of device isolation structures, for example, a shallow trench isolation (STI) structure.

Some sides of the semiconductor die 211 may be molded using a sealing material 250 such as epoxy molding resin. The semiconductor die 211 may be electrically connected to an external device through a redistribution line 217 which extends towards the peripheral area FOA. The redistribution line 217 may be electrically connected to the semiconductor die 211 through a contact pad 213. In some example embodiments, the redistribution line 217 may be directly electrically connected to the semiconductor die 211.

An exposed surface of the semiconductor die 211 and a side of the sealing material 250 may be covered by a passivation layer 215.

An insulating layer 220 may be provided on the passivation layer 215 and the redistribution line 217. The insulating layer 220 may be substantially the same as the insulating layer 120 described with reference to FIG. 2, and a further description of the insulating layer 220 will be omitted here.

The insulating layer 220 may include an opening 222. A via 224 electrically connected to the redistribution line 217 may be in the opening 222. In particular, to configure a fan-out structure, the opening 222 of the insulating layer 220 may be in the peripheral area FOA.

The via 224 may include a via liner, a via barrier layer, and a via core. The via core may be formed to have a pillar shape, and a side of the via core may be coated by the via barrier layer and the via liner.

The via liner may include a material such as a silicon oxide, silicon nitride, or silicon oxynitride. The via barrier layer may include titanium (Ti), titanium nitride (TiN), titanium tungsten (TiW), tantalum (Ta), tantalum nitride (TaN), tungsten nitride (WN), or other metals having low reactivity. The via core may include a metal such as copper (Cu).

An under-bump metal layer 230 and a conductive bump 240 may be provided, for example sequentially provided on the via 224. The under-bump metal layer 230 and the conductive bump 240 are described above in detail with reference to FIG. 2, and thus a further description thereof will be omitted here.

The insulating layer 220 may have recesses 225 near the opening 222. The recesses 225 are substantially similar to or the same as the recesses described above with reference to FIGS. 2 and 4A to 4D, and thus a further description thereof will be omitted here.

A height H1 of the via 224 may be greater than a depth H2 of the recesses 225. For example, the depth H2 of the recesses 225 may be about 10% to about 90% of the height H1 of the via 224. When the depth H2 of the recesses 225 is too shallow, the elongation of a transmission path of a lateral force by the recesses 225 may be negligible, so that the impact resistant improvement may be insufficient. When the depth H2 of the recesses 255 is too deep, an external force may be transmitted to the bottom of the recesses 225, thus possibly causing cracking near the bottom of the recesses 225.

A sidewall of the opening 222 may be substantially perpendicular to an upper surface 220u of the insulating layer 220. By forming the sidewall of the opening 222 to be substantially perpendicular to the upper surface 220u of the insulating layer 220, cracking may become less likely to occur when an external force is transmitted to the redistribution line 217.

The recesses 225 may at least partially include a portion having a substantially constant width, or a varying width that becomes narrower towards the bottom of the recesses 225. In other words, each, or at least one, of the recesses 225 may have a width which does not monotonically decrease towards the bottom thereof. When the width of the recess 225 monotonically decreases towards the bottom thereof, such issues as described above with reference to FIG. 4E may occur.

FIGS. 7A to 7D are conceptual sectional views of recesses according to example embodiments.

Figure 7A:
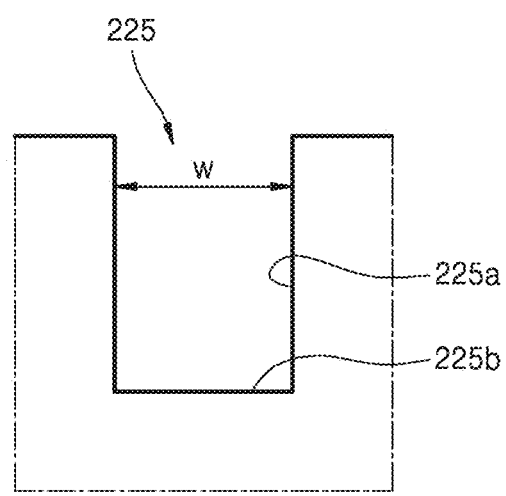
FIGS. 7A to 7D are conceptual sectional views of recesses according to example embodiments.

Referring to FIG. 7A, a recess 225 may include a sidewall portion 225a and a bottom portion 225b. As illustrated in FIG. 7A, the recess 225 may have a substantially constant width W at any height level. In this case, as described above with reference to FIG. 4A, an external force in a horizontal direction may be effectively blocked, and the transmission path of the external force may also be elongated. This may also contribute to improving the impact resistance of the semiconductor package 200.

Figure 7B:
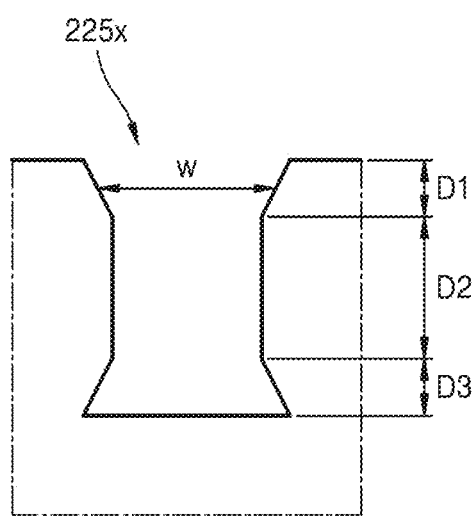

Referring to FIG. 7B, a recess 225x may include a narrowing width region D1 in which the width W of the recess 225 decreases towards the bottom of the recess 225x, a constant width region D2 in which the width W of the recess 225 is maintained substantially constant, and an increasing width region D3 in which the width W of the recess 225 increases towards the bottom of the recess 225x. The constant width region D2 may have a substantially similar or same effect as described above with reference to FIG. 4A, and the increasing width region D3 may have a substantially similar or same effect as described above with reference to FIG. 4B.

Figure 7C:
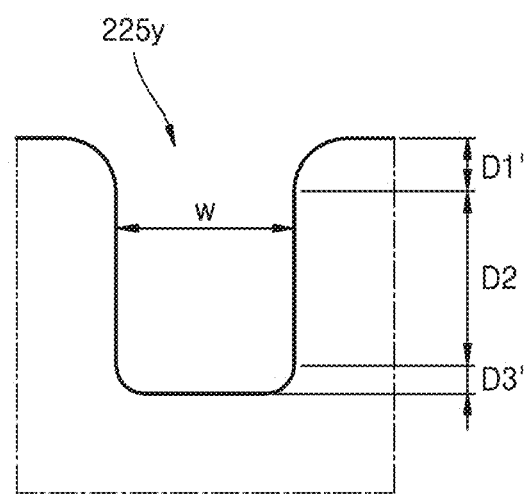

Referring to FIG. 7C, a recess 225y may include narrowing width regions D1' and D3' in which the width W of the recess 225y decrease towards the bottom of the recess 225y, and a constant width region D2 in which the width W of the recess 225y is maintained substantially constant. For example, the width W of the recess 255y may gradually decrease downwards from the top region of the recess 255y (D1'), be maintained substantially constant (D2), and then gradually decrease again towards the bottom of the recess 255y (D3'). In the narrowing width regions D1' and D3', edge portions of the recess 255y may be substantially curved or round rather than sharp. By rounding the edge portions of the recess 255y, the concentration of an external force on a particular site may be reduced or prevented, and consequentially an impact resistance improvement effect may be obtained.

Figure 7D:
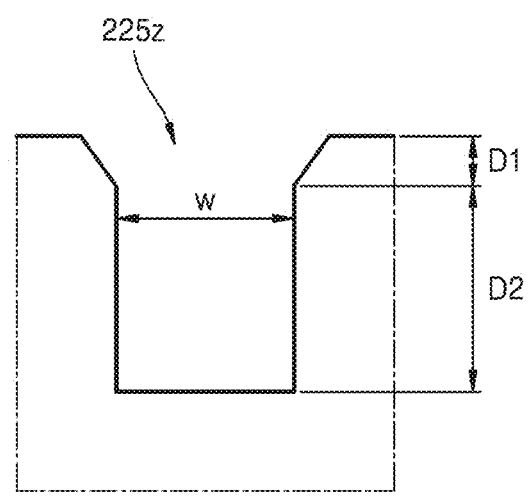

Referring to FIG. 7D, a recess 225z may include a narrowing width region D1 in which the width W of the recess 225z decreases towards the bottom of the recess 225z, and a constant width region D2 in which the width W of the recess 225z is maintained substantially constant. The constant width region D2 may have a substantially similar effect as described above with reference to FIG. 4A.

Figure 8A:
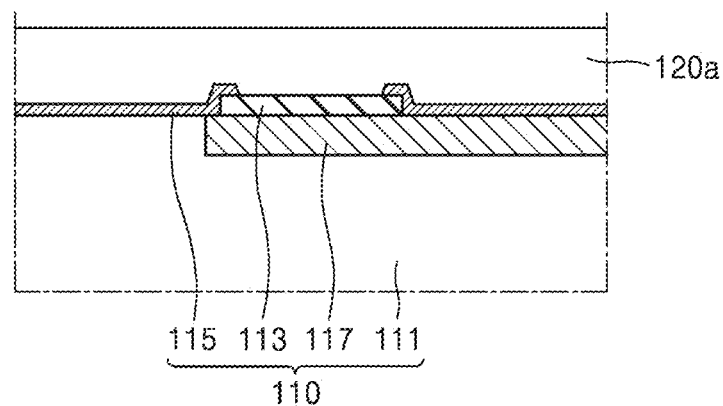
FIGS. 8A to 8C are cross-sectional views sequentially illustrating a method of fabricating a semiconductor device according to an example embodiment.
Figure 8B:
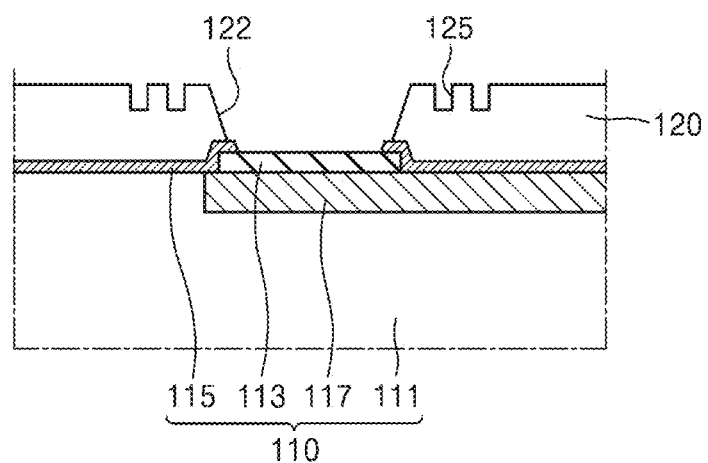
Figure 8C:
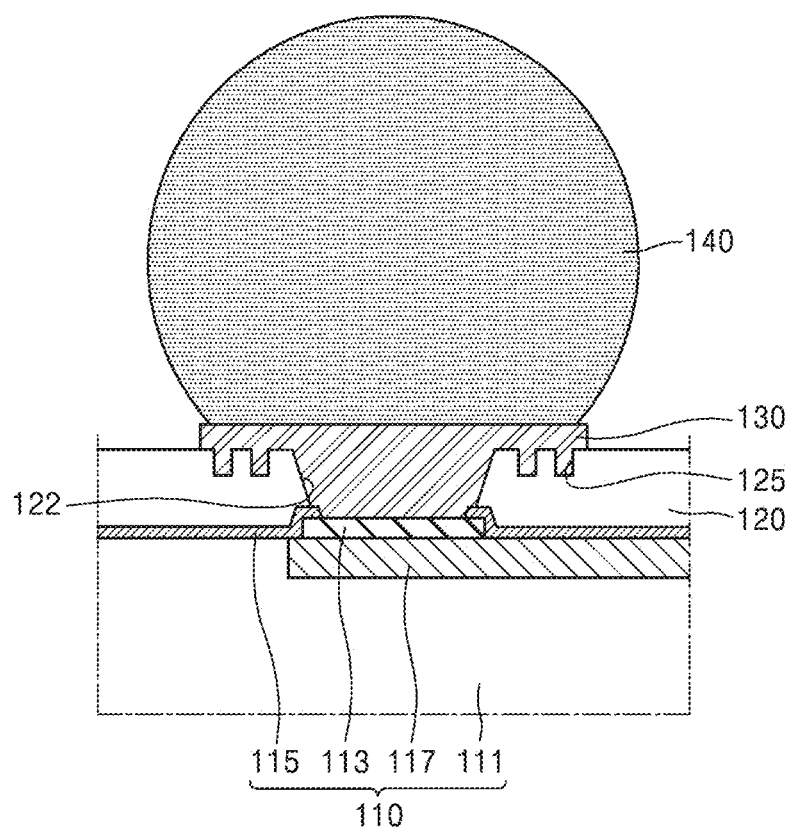

FIGS. 8A to 8C are cross-sectional views sequentially illustrating a method of fabricating a semiconductor device according to an example embodiment.

Referring to FIG. 8A, a substrate 110 having conductive layers 113 and 117 is prepared. The substrate 110 has been described above in detail with reference to FIG. 2, and thus a further description thereof will be omitted here.

An insulating material layer 120a may be formed on a surface of the substrate 110. The insulating material layer 120a may include any material for forming a passivation layer, for example, an Ajinomoto build-up film (ABF). The insulating material layer 120a may be formed by spin coating, spray coating, screen printing, lamination, chemical vapor deposition (CVD), or physical vapor deposition (PVD). However, example embodiments are not limited thereto.

Referring to FIG. 8B, an insulating layer 120 may be formed by patterning the insulating material layer 120a. The insulating layer 120 may be formed to have an opening 122 and recesses 125 therein. The opening 122 and the recesses 125 may be contemporaneously or separately formed. The opening 122 and the recesses 125 may be formed by using a method such as photolithography or laser drilling. For example, the opening 122 and the recesses 125 may be formed by laser drilling, for example, with a UV laser or excimer laser.

Referring to FIG. 8C, an under-bump metal layer 130 and a conductive bump 140 may be formed, for example sequentially formed.

The under-bump metal layer 130 may be formed by, for example, plating. A seed layer for the plating may be formed first. The seed layer may include titanium (Ti), copper (Cu), chromium (Cr), tungsten (W), aluminum (Al), nickel (Ni), vanadium (V), or an alloy thereof. The plating may be performed using a method, for example, electroplating, electroless plating, or immersion plating. The features of the under-bump metal layer 130 as an adhesive layer, a diffusion preventing layer, and a wetting layer has been described above with reference to FIG. 2, and thus a further description thereof will be omitted here.

The conductive bump 140 may be formed by applying a solder bump or solder paste using a method such as dotting, screen printing, doctor blading, evaporation, electroplating, or electroless plating and heating the applied solder bump or solder paste to above a melting point to make it reflow. Optionally, the solder bump or solder paste may include a flux solution. Appropriate materials of the conductive bump 140 have been described above with reference to FIG. 2, and thus a further description thereof will be omitted here.

A semiconductor device and a semiconductor package according to any of the above-described example embodiments may have remarkably improved drop test characteristics and impact resistance.

Figure 9:
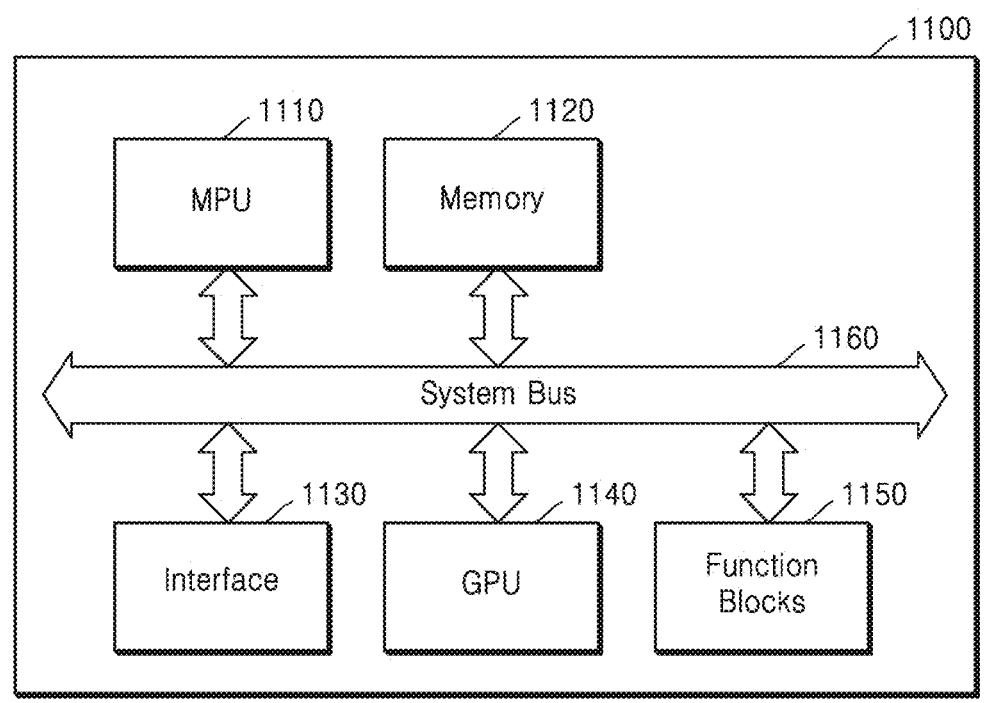
FIG. 9 is a schematic block diagram illustrating a structure of a semiconductor package according to an example embodiment.

FIG. 9 is a schematic block diagram illustrating a structure of a semiconductor package 1100 according to an example embodiment.

Referring to FIG. 9, the semiconductor package 1100 may include a microprocessor unit (MPU) 1110, a memory 1120, an interface 1130, a graphics processing unit (GPU) 1140, function blocks 1150, and a bus 1160 which connect these units. The semiconductor package 1100 may include both or one of the microprocessor unit 1110 and the graphic processor unit 1140.

The MPU 1110 may include a core and a L2 cache. For example, the MPU 1110 may include multiple cores. Each, or at least one core of the multiple cores may have the same or different performance. The multiple cores may be simultaneously or contemporaneously activated, or may be separately activated at different timings. The memory 1120 may store, for example, a result of processing performed in the function blocks, under the control of the MPU 1110. For example, under the control of the MPU 1110, contents stored in the L2 cache may be stored in the memory 1120 as the L2 cache is flushed. The interface 1120 may interface with external devices. For example, the interface 1130 may interface with a camera, a liquid crystal display (LCD) or a speaker.

The GPU 1140 may perform graphics functions. For example, the GPU 1140 may perform video codec processing or 3D-graphics processing.

The function blocks 1150 may perform a variety of functions. For example, when the semiconductor package 1100 is an application process (AP) for use in a mobile device, at least one of the function blocks 1150 may perform a communication function.

The semiconductor package 1100 may include the semiconductor device 100 or the semiconductor package 200 described as embodiments with reference to FIGS. 2 and 6. The interface 1130 and the function blocks 1150 may correspond to parts of the semiconductor package 100 or 200 of FIG. 2 or 6.

The semiconductor package 1100 may have improved reliability in terms of electrical connection, and may also be formed to have a smaller size with fine pitches. Accordingly, the semiconductor package 1100 may be highly integrated with high reliability.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
  a substrate including a first insulating layer and a conductive layer;
  a second insulating layer coating the substrate, the second insulating layer including an opening exposing at least part of the conductive layer and two or more recesses encircling the opening, each of sidewalls of the opening and the recesses being slanted at an obtuse angle with regard to bottoms of the opening and the recesses;
  an under-bump metal layer electrically connected to the at least part of the conductive layer;
  a via physically contacting both the under-bump metal layer and the at least part of the conductive layer; and
  a solder bump on the under-bump metal layer,
  wherein the two or more recesses are not physically in contact with the conductive layer,
  wherein a depth of the two or more recesses is about 10% to about 90% of a height of the via, and
  wherein the two or more recesses are circular trenches surrounding the opening, and a sidewall of the under-bump metal layer is disposed farther from the center of the opening than the sidewalls of the recesses.

2. The semiconductor device of claim 1, wherein the sidewall and a bottom of the recess do not have an interface therebetween.

3. The semiconductor device of claim 1, wherein the conductive layer includes a first conductive layer and a conductive pad, an upper surface of the first insulating layer being flush with an upper surface of the first conductive layer.

4. The semiconductor device of claim 1, wherein the two or more recesses include at least a micro-recess in the sidewall of the two or more recesses.

5. The semiconductor device of claim 1, wherein the sidewall of the two or more recesses includes consecutive scallops.

6. The semiconductor device of claim 1, wherein an upper surface of the under-bump metal layer is substantially planar in a region outside the opening.

7. The semiconductor device of claim 1, further comprising a passivation layer between the second insulating layer and the substrate.

8. The semiconductor device of claim 1, wherein edge portions of the two or more recesses are rounded.

9. A semiconductor device comprising:
  a substrate including a first insulating layer and a conductive layer;
  a second insulating layer coating the substrate, the second insulating layer including an opening exposing at least part of the conductive layer and two or more recesses encircling the opening, a sidewall of the opening being slanted at an obtuse angle with regard to bottom of the opening;
  an under-bump metal layer electrically connected to the at least part of the conductive layer;
  a via physically contacting both the under-bump metal layer and the at least part of the conductive layer; and
  a solder bump on the under-bump metal layer,
  wherein the two or more recesses are not physically in contact with the conductive layer,
  wherein a depth of the two or more recesses is about 10% to about 90% of a height of the via,
  wherein at least one of the two or more recesses includes:
    a first narrowing width region in which the width of the recess decreases towards a bottom of the recess, and
    a constant width region in which the width of the recess is constant.

10. The semiconductor device of claim 9, further comprising a second narrowing width region in which the width of the recess decreases towards the bottom of the recess, wherein the constant width region being between the first narrowing width region and the second narrowing width region.

11. The semiconductor device of claim 10, wherein the first narrowing width region is rounded.

12. The semiconductor device of claim 11, wherein the second narrowing width region is rounded.

13. The semiconductor device of claim 9, wherein the constant width region is between the first narrowing width region and the bottom of the recess.

14. The semiconductor device of claim 13, wherein the first narrowing width region is rounded.

15. The semiconductor device of claim 9, wherein the two or more recesses are circular trenches surrounding the opening, and a sidewall of the under-bump metal layer is disposed farther from the center of the opening than the sidewalls of the recesses.

16. A semiconductor device comprising:
  a substrate including a first insulating layer and a conductive layer;
  a second insulating layer coating the substrate, the second insulating layer including an opening exposing at least part of the conductive layer and two or more recesses surrounding the opening, each of sidewalls of the opening and the recesses being slanted at an obtuse angle with regard to bottoms of the opening and the recesses;
  an under-bump metal layer electrically connected to the at least part of the conductive layer;
  a via physically contacting both the under-bump metal layer and the at least part of the conductive layer; and
  a solder bump on the under-bump metal layer,
  wherein the two or more recesses are not physically in contact with the conductive layer,
  wherein a depth of the two or more recesses is about 10% to about 90% of a height of the via, and
  wherein each of the two or more recesses surrounds the opening as a rectangular or square trench.

17. The semiconductor device of claim 16, wherein a sidewall of the under-bump metal layer is disposed farther from the center of the opening than the sidewalls of the recesses.

18. The semiconductor device of claim 16, wherein the via is integrated with the under-bump metal layer.

19. The semiconductor device of claim 16, wherein the sidewall and a bottom of the recess do not have an interface therebetween.

20. The semiconductor device of claim 16, wherein the conductive layer includes a first conductive layer and a conductive pad, an upper surface of the first insulating layer being flush with an upper surface of the first conductive layer.

* * * * *